US012604423B2

(12) United States Patent
Je et al.

(10) Patent No.: US 12,604,423 B2
(45) Date of Patent: Apr. 14, 2026

(54) ELECTRONIC DEVICE INCLUDING CAMERA MODULE

(71) Applicant: SAMSUNG ELECTRONICS CO., LTD., Suwon-si (KR)

(72) Inventors: Jongjoo Je, Suwon-si (KR); Sanghun Park, Suwon-si (KR); Sohyeon Park, Suwon-si (KR); Myunghyo Bae, Suwon-si (KR); Yonggil Han, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 150 days.

(21) Appl. No.: 18/420,272

(22) Filed: Jan. 23, 2024

(65) Prior Publication Data

US 2024/0314947 A1 Sep. 19, 2024

Related U.S. Application Data

(63) Continuation of application No. PCT/KR2023/021924, filed on Dec. 28, 2023.

(30) Foreign Application Priority Data

Jan. 26, 2023 (KR) ........................ 10-2023-0009973
Feb. 9, 2023 (KR) ........................ 10-2023-0017504

(51) Int. Cl.
*G06F 1/16* (2006.01)
*H05K 5/00* (2025.01)
(Continued)

(52) U.S. Cl.
CPC ..................................... *H05K 5/02* (2013.01)

(58) Field of Classification Search
CPC ...... H05K 5/02; H05K 5/0204; H05K 5/0208; G06F 1/1686; G06F 1/1626; H04N 23/55; H04N 23/57
See application file for complete search history.

(56) References Cited

U.S. PATENT DOCUMENTS 9,049,279 B2 6/2015 Choi et al.
10,819,888 B2 * 10/2020 Xu .......................... H04N 23/54
(Continued)

FOREIGN PATENT DOCUMENTS

CN 113037951 A 6/2021
CN 214101466 U 8/2021
(Continued)

OTHER PUBLICATIONS

International Search Report corresponding to Application No. PCT/KR2023/021924; Dated Apr. 4, 2024.

*Primary Examiner* — Anthony M Haughton
(74) *Attorney, Agent, or Firm* — CANTOR COLBURN LLP

(57) ABSTRACT

An electronic device includes a housing, an optical module disposed in an inner space of the housing, and a window bracket disposed in the inner space of the housing and connected to an outside surface. The window bracket includes a flange including an opening disposed at a position corresponding to the optical module, a boss e surrounding an edge of the opening at a height from the flange, and a stepped portion provided along an edge of the boss and including a step surface and an inner surface extending perpendicularly from the step surface. A window is attached to the window bracket through an adhesive member disposed on the step surface, where the inner surface of the stepped portion includes a recess having a depth, where the recess is configured so the height from the step surface to a first point is greater than the thickness of the adhesive member.

19 Claims, 15 Drawing Sheets

(51) Int. Cl.
    *H05K 5/02*         (2006.01)
    *H05K 7/00*         (2006.01)

(56)           References Cited

U.S. PATENT DOCUMENTS

| | | | |
|---|---|---|---|
| 11,429,158 B2 | 8/2022 | Browning et al. | |
| 11,603,032 B2 * | 3/2023 | Lee | B60R 1/1207 |
| 11,616,896 B2 * | 3/2023 | Akana | H04N 23/90 |
| | | | 455/556.1 |
| 11,902,639 B2 * | 2/2024 | Baek | H04N 23/00 |
| 12,388,919 B2 * | 8/2025 | Jung | H04N 23/685 |
| 2014/0253799 A1 * | 9/2014 | Moon | H04N 23/57 |
| | | | 348/376 |
| 2020/0084349 A1 | 3/2020 | Huang et al. | |
| 2022/0394157 A1 * | 12/2022 | Baek | H04N 23/00 |
| 2023/0221782 A1 * | 7/2023 | Hurrell | H04M 1/0202 |
| | | | 361/720 |

FOREIGN PATENT DOCUMENTS

| | | | |
|---|---|---|---|
| CN | 114025065 A | 2/2022 |
| CN | 115514833 A | 12/2022 |
| CN | 118200696 A | 6/2024 |
| EP | 2779597 A2 | 9/2014 |
| EP | 3840353 A1 | 6/2021 |
| KR | 20170036283 A | 4/2017 |
| KR | 20190110225 A | 9/2019 |
| KR | 20220092138 A | 7/2022 |
| KR | 102755658 B1 | 1/2025 |

* cited by examiner

ELECTRONIC DEVICE INCLUDING CAMERA MODULE

This application claims priority to Korean Patent Application No. 10-2023-0009973, filed on Jan. 26, 2023, and Korean Patent Application No. 10-2023-0017504, filed on Feb. 9, 2023, and all the benefits accruing therefrom under 35 U.S.C. § 119, the contents of which in their entirety are herein incorporated by reference.

TECHNICAL FIELD

Various embodiments of the disclosure relate to an electronic device including a camera module.

BACKGROUND ART

As the functional gap between electronic devices from each manufacturer has decreased, the electronic devices are gradually becoming slimmer in order to meet consumers' purchasing needs, and development is being conducted to increase the rigidity of the electronic devices, strengthen design aspects of the electronic devices, and ensure functional differentiation thereof. An electronic device may include at least one structure attached to at least a portion of a housing via an adhesive member to be visible from the outside. The at least one structure may be used as an external environment connection structure for at least one electronic component disposed to detect the external environment in the inner space of the electronic device. The at least one structure may be firmly fixed while maintaining its functionality, or may be designed to help create an attractive appearance of the electronic device.

DISCLOSURE OF INVENTION

Technical Problem

An adhesive member may be used in an electronic device to bond two structures. For example, the two structures may be fixed by placing an adhesive member such as double-sided tape on a first structure and/or a second structure and pressing the structures together. In particular, the adhesive member disposed between two structures through compression may adversely affect other surrounding structures when the adhesive material of the adhesive member overflows to the outside. In this case, when the two structures are spaced apart from each other by a certain distance to prevent the overflow of the adhesive material, it will work against slimming of the electronic device, and when a limited bonding area is required, the bonding strength may be weakened by reducing the bonding area.

An electronic device may include at least one camera module disposed in an inner space thereof. The at least one camera module as a first structure may be exposed to the outside through a window bracket and may be disposed to detect the external environment through a window as a second structure fixed to a window bracket. The window may be fixed to a stepped portion in the window bracket via an adhesive member. In this case, when the adhesive material of the adhesive member leaks or overflows into the gap between the stepped portion of the window bracket and the window, it may work against creating an attractive appearance of the electronic device. When the stepped portion of the window bracket is spaced apart from the window in order to reduce the above-mentioned problems, the bonding area increases inward, making it difficult to form an attractive appearance by expanding a black matrix (BM) area (e.g., a printing area) for the camera module. In addition, when the bonding area is reduced in order to maintain the BM area, the bonding strength between the window and the window bracket may be weakened.

Solution to Problem

According to various embodiments, an electronic device may include a camera module that is capable of helping create an attractive appearance of the electronic device.

According to various embodiments, an electronic device may include a camera module that is capable of helping ensure bonding strength.

According to various embodiments, an electronic device may include a camera module that is capable of helping reduce a BM area when bonding strength is ensured in a limited bonding area.

According to various embodiments, an electronic device may include a housing, at least one optical module disposed in an inner space of the housing, and a window bracket disposed in the inner space of the housing to be at least partially connected to the outside. The window bracket may include a flange including at least one opening disposed at a position corresponding to the at least one optical module, a boss extending to surround an edge of the at least one opening at a predetermined height from the flange, and a stepped portion provided along an edge of the boss and including a step surface and an inner surface perpendicularly extending from the step surface. The window bracket may include a window attached to the window bracket through an adhesive member disposed on at least a portion of the step surface, where the inner surface of the stepped portion may include a recess having a predetermined depth, and where the recess may be configured such that the height from the step surface to a first point where the recess starts is greater than the thickness of the adhesive member.

According to various embodiments, an electronic device may include a first structure including a stepped portion including a step surface and an inner surface extending from the step surface to a top surface, and a second structure that is at least partially attached via an adhesive member disposed on the step surface of the first structure. The inner surface may include a recess defined at a predetermined depth, and the recess may be configured such that the height from the step surface to a first point where the recess starts is greater than the thickness of the adhesive member.

Advantageous Effects of Invention

An electronic device according to an embodiments includes a recess defined at a predetermined depth and shape in a space for receiving the adhesive material of an adhesive member provided on the inner surface of a stepped portion of a window bracket. As a result, expansion of a bonding area can help increase the bonding strength, and when the bonding area is the same, reduction of a BM area can help create an attractive appearance of the electronic device.

Various other embodiments identified directly or indirectly through this disclosure can be provided.

The embodiments are not limited to those described herein, and other embodiments not described herein may be clearly understood by a person ordinarily skilled in the art to which the invention belongs.

BRIEF DESCRIPTION OF DRAWINGS

In connection with the description of the drawings, the same or similar components may be denoted by the same or similar reference numerals.

FIG. 5A is a partial cross-sectional view of the electronic device taken along line 5a-5a in FIG. 2, according to an embodiment.

FIG. 5B is an enlarged view of an area 5b in FIG. 5A, according to an embodiment.

FIG. 5C is a partial cross-sectional view illustrating a state in which a window is attached to a window bracket including a recess, according to an embodiment.

FIG. 5D is a partial cross-sectional view illustrating a state in which a window is attached to a window bracket including a recess, according to an embodiment.

FIG. 7A is a cross-sectional view illustrating a coupled state between a window bracket including a recess and a window, according to an embodiment.

FIG. 7B is a cross-sectional view illustrating a coupled state between a window bracket including a recess and a window, according to an embodiment.

FIG. 7C is a cross-sectional view illustrating a coupled state between a window bracket including a recess and a window, according to an embodiment.

FIG. 7E is a cross-sectional view illustrating a coupled state between a window bracket including a recess and a window, according to an embodiment.

MODE FOR THE INVENTION

Figure 1:
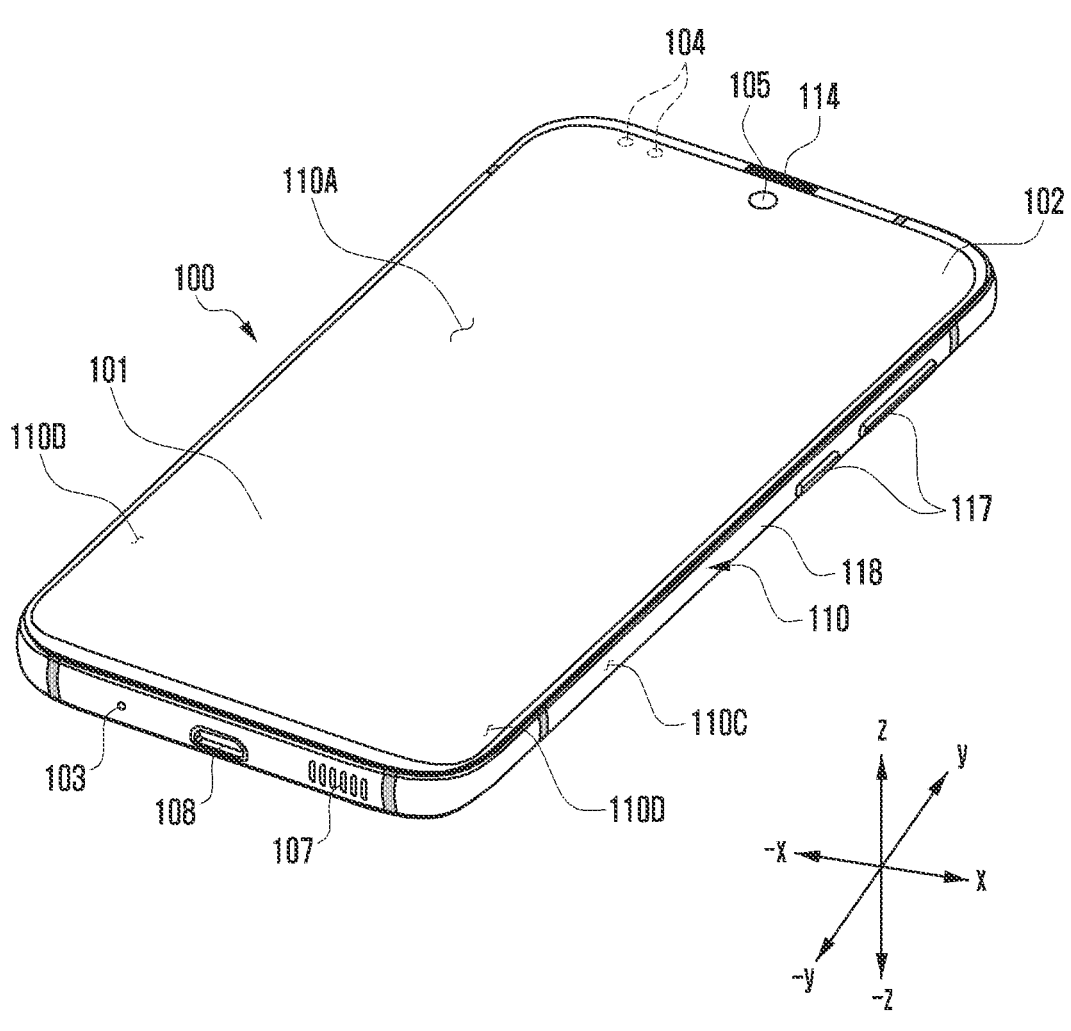
FIG. 1 is a front perspective view of an electronic device (e.g., a mobile electronic device), according to an embodiment.
Figure 2:
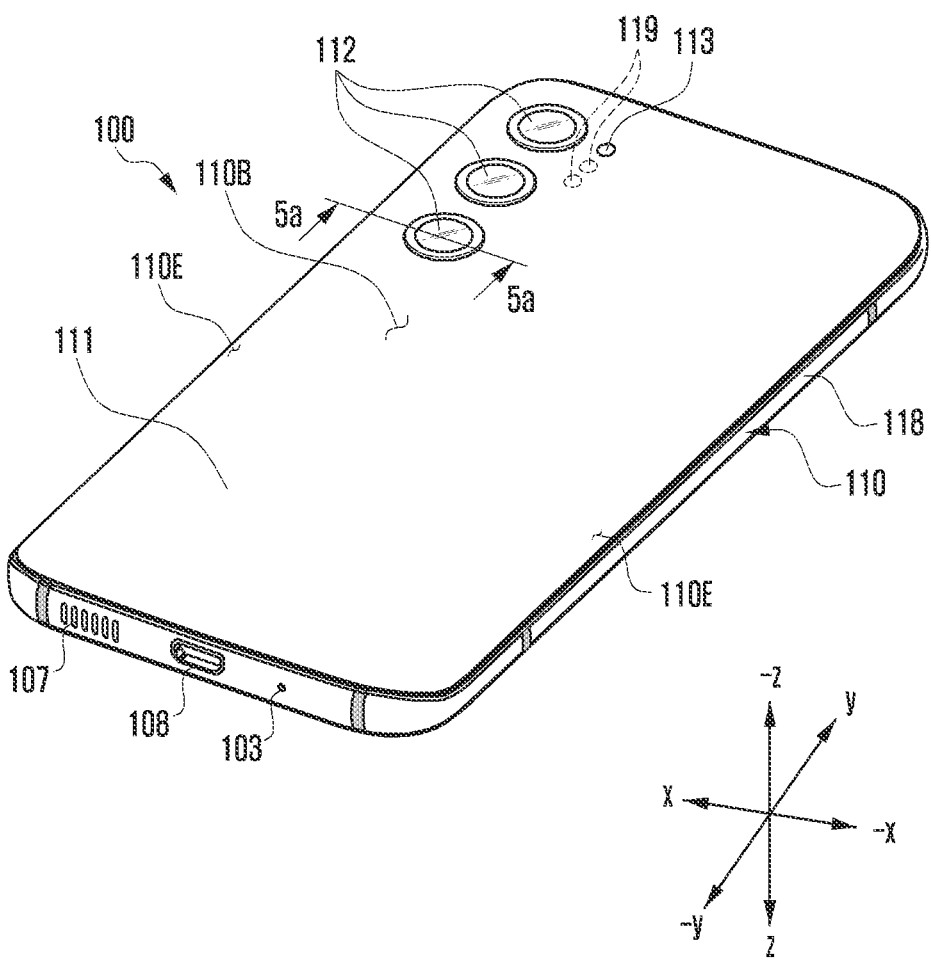
FIG. 2 is a rear perspective view of a rear surface of the electronic device of FIG. 1, according to an embodiment.

FIG. 1 illustrates a perspective view showing a front surface of a mobile electronic device according to an embodiment of the disclosure, and FIG. 2 illustrates a perspective view showing a rear surface of the mobile electronic device shown in FIG. 1 according to an embodiment of the disclosure.

Referring to FIGS. 1 and 2, a mobile electronic device 100 may include a housing 110 that includes a first surface (or front surface) 110A, a second surface (or rear surface) 110B, and a lateral surface 110C that surrounds a space between the first surface 110A and the second surface 110B. The housing 110 may refer to a structure that forms a part of the first surface 110A, the second surface 110B, and the lateral surface 110C. The first surface 110A may be formed of a front plate 102 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102 and the rear plate 111 and includes a metal and/or polymer. The rear plate 111 and the lateral bezel structure 118 may be integrally formed and may be of the same material (e.g., a metallic material such as aluminum).

The front plate 102 may include two first regions 110D disposed at long edges thereof, respectively, and bent and extended seamlessly from the first surface 110A toward the rear plate 111. Similarly, the rear plate 111 may include two second regions 110E disposed at long edges thereof, respectively, and bent and extended seamlessly from the second surface 110B toward the front plate 102. The front plate 102 (or the rear plate 111) may include only one of the first regions 110D (or of the second regions 110E). The first regions 110D or the second regions 110E may be omitted in part. When viewed from a lateral side of the mobile electronic device 100, the lateral bezel structure 118 may have a first thickness (or width) on a lateral side where the first region 110D or the second region 110E is not included, and may have a second thickness, being less than the first thickness, on another lateral side where the first region 110D or the second region 110E is included.

The mobile electronic device 100 may include at least one of a display 101, audio modules 103, 107 and 114, sensor modules 104 and 119, camera modules 105, 112 and 113, a key input device 117, a light emitting device, and connector hole 108. The mobile electronic device 100 may omit at least one (e.g., the key input device 117 or the light emitting device) of the above components, or may further include other components.

The display 101 may be exposed through a substantial portion of the front plate 102, for example. At least a part of the display 101 may be exposed through the front plate 102 that forms the first surface 110A and the first region 110D of the lateral surface 110C. The display 101 may be combined with, or adjacent to, a touch sensing circuit, a pressure sensor capable of measuring the touch strength (pressure), and/or a digitizer for detecting a stylus pen. At least a part of the sensor modules 104 and 119 and/or at least a part of the key input device 117 may be disposed in the first region 110D and/or the second region 110E.

The audio modules 103, 107 and 114 may correspond to a microphone hole 103 and speaker holes 107 and 114, respectively. The microphone hole 103 may contain a microphone disposed therein for acquiring external sounds and, in a case, contain a plurality of microphones to sense a sound direction. The speaker holes 107 and 114 may be classified into an external speaker hole 107 and a call receiver hole 114. The microphone hole 103 and the speaker holes 107 and 114 may be implemented as a single hole, or a speaker (e.g., a piezo speaker) may be provided without the speaker holes 107 and 114.

The sensor modules 104 and 119 may generate electrical signals or data corresponding to an internal operating state of the mobile electronic device 100 or to an external environmental condition. The sensor modules 104 and 119 may include a first sensor module 104 (e.g., a proximity sensor) and/or a second sensor module (e.g., a fingerprint sensor) disposed on the first surface 110A of the housing 110, and/or a third sensor module 119 (e.g., a heart rate monitor (HRM) sensor) and/or a fourth sensor module (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device 105 disposed on the first surface 110A of the electronic device 100, and a second camera device 112 and/or a flash 113 disposed on the second surface 110B. The camera module 105 or the camera module 112 may include one or more lenses, an image sensor, and/or an image signal processor. The flash 113 may include, for example, a light emitting diode or a xenon lamp. Two or more lenses (infrared cameras, wide angle and telephoto lenses) and image sensors may be disposed on one side of the electronic device 100.

The key input device 117 may be disposed on the lateral surface 110C of the housing 110. The mobile electronic device 100 may not include some or all of the key input device 117 described above, and the key input device 117 which is not included may be implemented in another form such as a soft key on the display 101. The key input device 117 may include the sensor module disposed on the second surface 110B of the housing 110.

The light emitting device may be disposed on the first surface 110A of the housing 110. For example, the light emitting device may provide status information of the electronic device 100 in an optical form. The light emitting device may provide a light source associated with the operation of the camera module 105. The light emitting device may include, for example, a light emitting diode (LED), an IR LED, or a xenon lamp.

The connector hole 108 may include a first connector hole 108 adapted for a connector (e.g., a universal serial bus (USB) connector) for transmitting and receiving power and/or data to and from an external electronic device. The connector hole 108 may include a second connector hole (not shown) adapted for a connector (e.g., an earphone jack) for transmitting and receiving an audio signal to and from an external electronic device.

Some sensor modules 105 of camera modules 105 and 212, some sensor modules 104 of sensor modules 104 and 119, or an indicator may be arranged to be exposed through a display 101. For example, the camera module 105, the sensor module 104, or the indicator may be arranged in the internal space of an electronic device 100 so as to be brought into contact with an external environment through an opening of the display 101, which is perforated up to a front plate 102. In another embodiment, some sensor modules 104 may be arranged to perform their functions without being visually exposed through the front plate 102 in the internal space of the electronic device. For example, in this case, an area of the display 101 facing the sensor module may not require a perforated opening.

Figure 3:
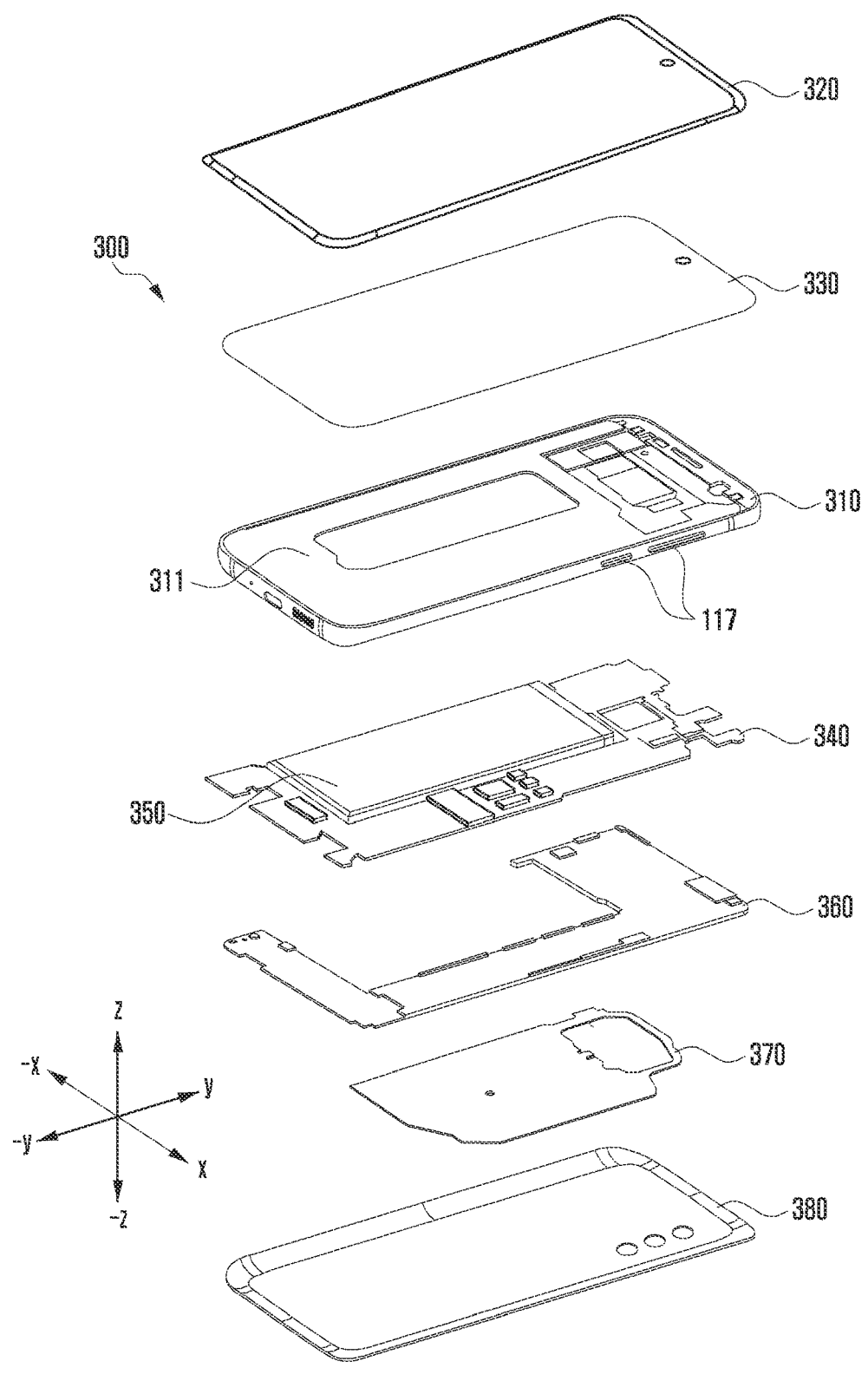
FIG. 3 is an exploded perspective view of the electronic device of FIG. 1, according to an embodiment.

FIG. 3 illustrates an exploded perspective view showing a mobile electronic device shown in FIG. 1 according to an embodiment of the disclosure.

The electronic device 300 in FIG. 3 may be at least partially similar to the electronic device 100 in FIG. 1 and FIG. 2 or may further include other embodiments.

Referring to FIG. 3, a mobile electronic device 300 may include a lateral bezel structure 310, a first support member 311 (e.g., a bracket), a front plate 320, a display 330, an electromagnetic induction panel (not shown), a printed circuit board (PCB) 340, a battery 350, a second support member 360 (e.g., a rear case), an antenna 370, and a rear plate 380. The mobile electronic device 300 may omit at least one (e.g., the first support member 311 or the second support member 360) of the above components or may further include another component. Some components of the electronic device 300 may be the same as or similar to those of the mobile electronic device 100 shown in FIG. 1 or FIG. 2, thus, descriptions thereof are omitted below.

The first support member 311 is disposed inside the mobile electronic device 300 and may be connected to, or integrated with, the lateral bezel structure 310. The first support member 311 may be formed of, for example, a metallic material and/or a non-metal (e.g., polymer) material. The first support member 311 may be combined with the display 330 at one side thereof and also combined with the printed circuit board (PCB) 340 at the other side thereof. On the PCB 340, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, one or more of a volatile memory and a non-volatile memory.

The interface may include, for example, a high definition multimedia interface (HDMI), a USB interface, a secure digital (SD) card interface, and/or an audio interface. The interface may electrically or physically connect the mobile electronic device 300 with an external electronic device and may include a USB connector, an SD card/multimedia card (MMC) connector, or an audio connector.

The battery 350 is a device for supplying power to at least one component of the mobile electronic device 300, and may include, for example, a non-rechargeable primary battery, a rechargeable secondary battery, or a fuel cell. At least a part of the battery 350 may be disposed on substantially the same plane as the PCB 340. The battery 350 may be integrally disposed within the mobile electronic device 300, and may be detachably disposed from the mobile electronic device 300.

The antenna 370 may be disposed between the rear plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or transmit and receive power required for charging wirelessly. An antenna structure may be formed by a part or combination of the lateral bezel structure 310 and/or the first support member 311.

Figure 4:
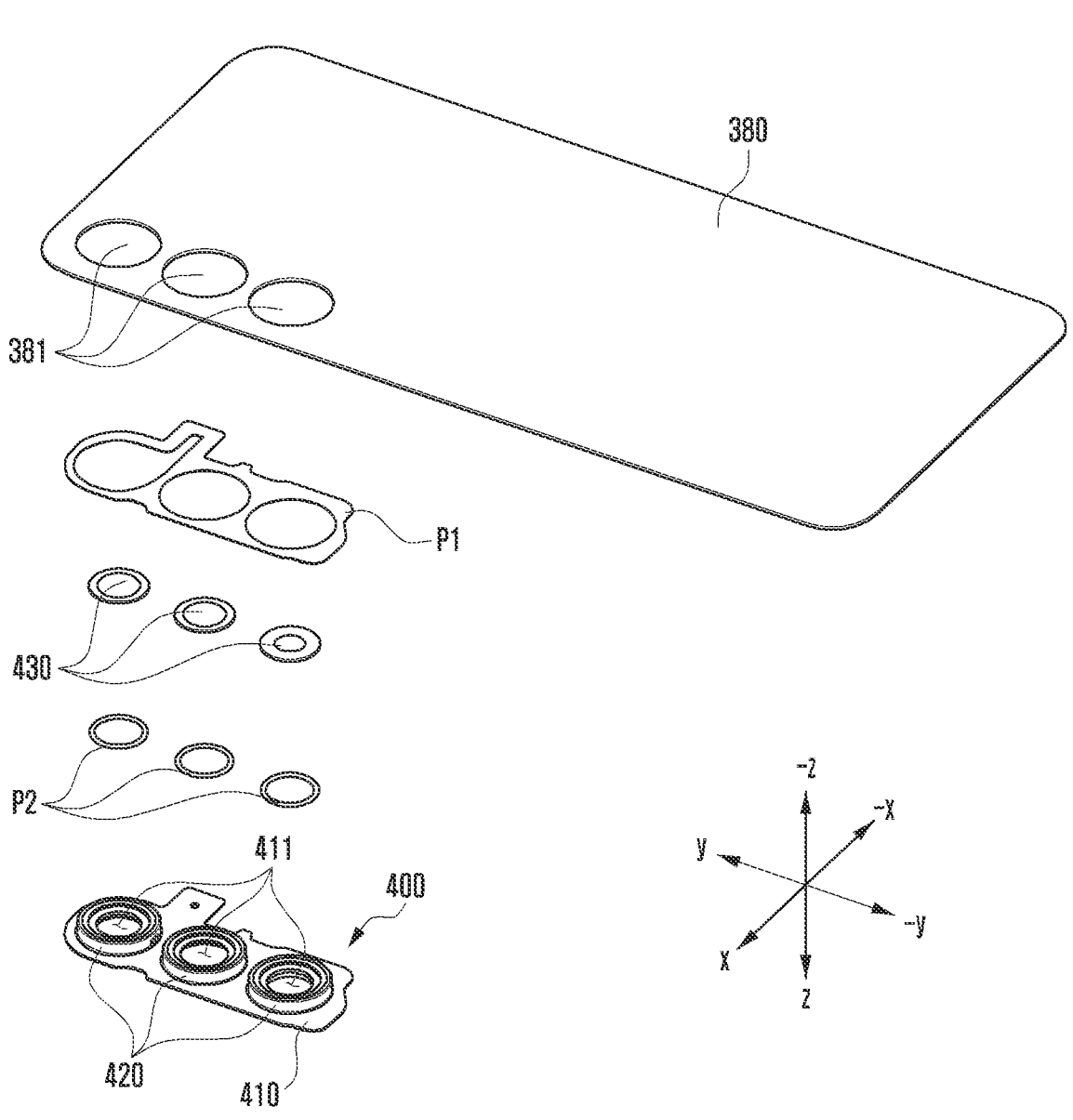
FIG. 4 is an exploded perspective view illustrating a window bracket and a rear cover, according to an embodiment.

FIG. 4 is an exploded perspective view illustrating a window bracket and a rear cover, according to an embodiment.

In an embodiment and referring to FIG. 4, an electronic device (e.g., the electronic device 300 in FIG. 3) may include a window bracket 400 as a first structure disposed in an inner space (e.g., the inner space 3001 in FIG. 5A) to be at least partially exposed to the outside. In an embodiment, the window bracket 400 may be disposed to be attached to the inner surface of a rear cover 380 (e.g., the rear plate 111 in FIG. 2) via an adhesive member P1 (e.g., double-sided tape or a bonding material). In an embodiment, the window bracket 400 may include a flange 410 including at least one opening 411, and at least one boss 420 extending to a predetermined height toward the rear cover (e.g., in the −z-axis direction) along the edge of the at least one opening 411 of the flange 410. In an embodiment, the at least one boss 420 may be exposed to the outside after penetrating at least one through hole 381 provided at a corresponding position in the rear cover 380. In an embodiment, the at least one boss 420 may be disposed to protrude by a certain height from the outer surface of the rear cover 380. In an embodiment, the at least one boss 420 may be disposed to be flush with or be lower than the outer surface of the rear cover 380. In an embodiment, the window bracket 400 may be made of a metal material or a polymer material. In an embodiment, the window bracket 400 may include at least one window 430 as a second structure attached to the at least one boss 420 via an adhesive member P2 (e.g., double-sided tape or a bonding material) such that the at least one opening 411 is sealed. In an embodiment, the at least one window 430 may be made of transparent glass or transparent polymer. In an embodiment, the electronic device 300 may include at least one camera module (e.g., the camera module 112 of FIG. 2 or the camera module 510 of FIG. 5A) disposed in the inner space 3001 to correspond to the at least one opening 411 in the window bracket 400 and the at least one through hole 381 in the rear cover 380. The at least one camera module may detect the external environment through the at least one opening 411 and the at least one through hole 381.

According to an embodiment, a stepped portion (e.g., the stepped portion 421 in FIG. 5B) may be provided on the at least one boss 420 in the window bracket 400, and the window 430 may be disposed to be seated on the stepped portion 421. In this case, the stepped portion 421 of the window bracket 400 may include a recess (e.g., the recess 422 in FIG. 5B) configured to receive the adhesive material of the adhesive member P2 pushed out due to compression. In an embodiment, the transition space for the existing adhesive material is utilized as a bonding area via the recess 422 which is provided as a space for receiving the adhesive material of the adhesive member P2, thereby improving the fixing force of the window 430. In addition, when the adhesive member P2 with the same size is applied, it may help reduce the black matrix (BM) area of the window 430 via the recess 422.

Although not illustrated, in an embodiment, the window bracket 400 as the first structure (e.g., a first member or a first bracket) and the window 430 as the second structure (e.g., a second member or a first bracket) attached to the window bracket 400 via the adhesive member P2 may correspond to an exemplary embodiment. For example, the first structure and the second structure may be replaced with various components constituting the electronic device 300. In an embodiment, the first structure and/or the second structure may be replaced with at least a portion of the housing, at least a portion of the bracket, or at least one of electronic components or covers, wherein the housing, the bracket, and the electronic components or covers constitute the electronic device 300.

Figure 5A:
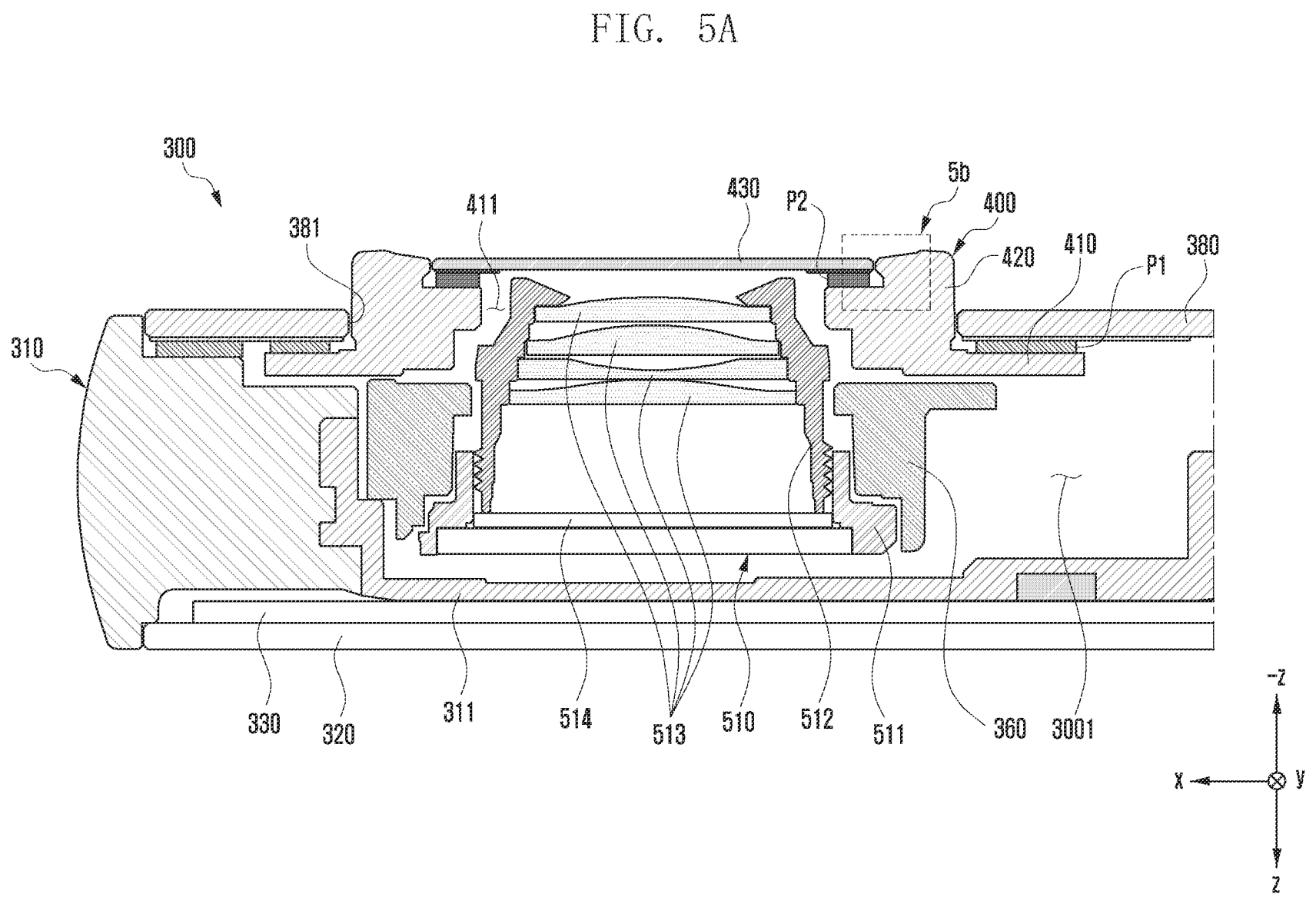
Figure 5B:
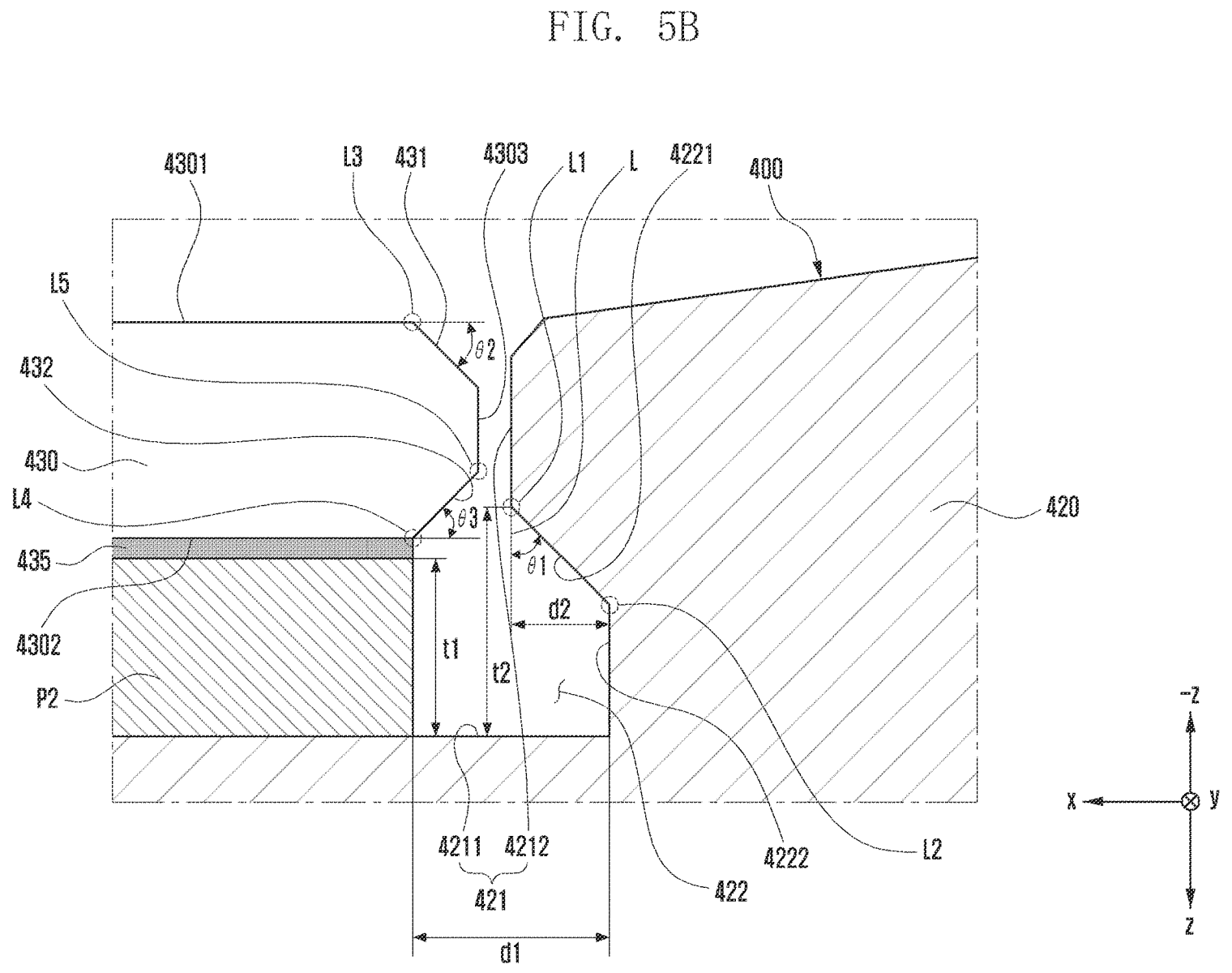

FIG. 5A is a partial cross-sectional view of the electronic device taken along line 5a-5a in FIG. 2, according to an embodiment. FIG. 5B is an enlarged view of an area 5b in FIG. 5A, according to an embodiment.

In an embodiment, the electronic device 300 of FIG. 5A may be at least partially similar to the electronic device 100 of FIG. 1 or may further include other embodiments of the electronic device 100.

In an embodiment and referring to FIGS. 5A and 5B, the electronic device 300 may include a front cover 320 (e.g., the front plate 102 in FIG. 1), a rear cover 380 (e.g., the rear plate 102 in FIG. 1), and a side member 310 (e.g., the side bezel structure 118 in FIG. 1) surrounding the inner space 3001 between the front cover 320 and the rear cover 380. In an embodiment, the electronic device 300 may include a housing structure (e.g., the housing 110 in FIG. 1) defined by the front cover 320, the rear cover 380, and the side member

310, and including the inner space 3001. In an embodiment, at least a portion of the side member 310 may be disposed to be visible from the outside as at least a portion of the side surface (e.g., the side 110C in FIG. 1). In an embodiment, the side member 310 may include a first support member 311 that extends at least partially into the inner space 3001. In an embodiment, the electronic device 300 may include at least one second support member 360 disposed in the inner space 3001. In an embodiment, the electronic device 300 may include a display 330 (e.g., the display 101 in FIG. 1) disposed in the inner space 3001 to be visible from the outside through at least a portion of the front cover 320.

In an embodiment, the electronic device 300 may include at least one camera module 510 (e.g., the camera module 112 in FIG. 2) disposed in the inner space 3001 to be supported by the first support member 311 and/or the second support member 360. In an embodiment, the camera module 510 may include a camera housing 511 disposed to be supported by the first support member 311 and/or the second support member 360, a lens housing 512 (e.g., a lens barrel or a barrel) disposed in the inner space of the camera housing 511 and at least partially disposed to face the rear cover 380 (e.g., in the −z axis direction), a plurality of lenses 513 arranged at regular intervals in the inner space of the lens housing 512, and at least one image sensor 514 disposed in the inner space of the camera housing 511 to acquire at least a portion of the light that has passed through the plurality of lenses 513. According to an embodiment, when the camera module 510 includes an autofocus (AF) function, the lens housing 512 may be moved in the camera housing 511 through a predetermined driver (not illustrated) such that the distance from the display 330 is variable. According to an embodiment, a separate driver may be disposed to change the position of at least one lens among the plurality of lenses 513 in order for the camera module 510 to perform the AF function. In another embodiment, in the camera module 510, the camera housing 511 may be omitted, and the lens housing 512 may be directly disposed on the first support member 311 and/or the second support member 360 through an alignment process.

In an embodiment, the electronic device 300 may include a window bracket 400 attached to the rear cover 380 in the inner space 3001 and including at least one opening 411. In an embodiment, the window bracket 400 may be disposed to be attached to the inner surface of the rear cover 380 via the adhesive member P1. In an embodiment, the window bracket 400 may include a flange 410 including at least one opening 411, and at least one boss 420 extending to a predetermined height toward the rear cover 380 (e.g., in the −z-axis direction) along the edge of the at least one opening 411 of the flange 410. In an embodiment, the at least one boss 420 may be exposed to the outside after penetrating at least one through hole 381 provided at a corresponding position in the rear cover 380. In an embodiment, the window bracket 400 may include at least one window 430 attached to the at least one boss 420 via an adhesive member P2 such that the at least one opening 411 is sealed.

In an embodiment, the window bracket 400 may include a stepped portion 421 provided along the edge of the opening 411 and configured to accommodate the window 430. In an embodiment, the stepped portion 421 may include a step surface 4211 provided lower than the top surface of the boss 420 and an inner surface 4212 perpendicularly extending from the step surface 4211 to the top surface of the boss 420. In an embodiment, the inner surface 4212 may be configured to have a slope. In an embodiment, when the window 430 is attached to the step surface 4211 of the stepped portion 421 via the adhesive member P2, the window 430 may be flush with the top surface of the boss 420 or may be lower than the top surface of the boss 420. In an embodiment, the window 430 may be disposed to be higher than the top surface of the boss 420. In an embodiment, the window bracket 400 may include a recess 422 having a space of a predetermined shape directed inward (e.g., in the −x-axis direction) (e.g., in the opposite direction to the adhesive member P2) from the inner surface 4212. In an embodiment, the recess 422 may be used as a space for receiving the adhesive material transferred (stretched, extended, leaked, or overflowed) from the adhesive member P2 when the window 430 is attached to the step surface 4211 by a predetermined pressing force.

According to various embodiments, the recess 422 may include a first surface 4221 extending from a first point L1 of the inner surface 4212 at a predetermined first angle θ1, and a second surface 4222 extending from a second point L2 of the first surface 4221 to the step surface 4211. In an embodiment, the first surface 4221 may be configured as an inclined surface having the first angle θ1 from the inner surface 4212. In an embodiment, the second surface 4222 may include a vertical surface extending from the second point L2 to the step surface 4211. In an embodiment, through inclined machining of the first surface 4221, the generation of burrs at the first point L1 and the second point L2 may be suppressed, which may be advantageous to ensure the resistance of the boss 420 against bending at the second point L2. In an embodiment, the first angle θ1 may have a range greater than about 0 degrees and less than or equal to about 90 degrees. In an embodiment, the thickness t1 of the adhesive member P2 may be equal to or smaller than the height t2 from the step surface 4211 to the first point L1 of the recess 422. For example, since height t2 of the first point L1 is equal to or higher than the thickness t1 of the adhesive member P2, the adhesive material transferred from the adhesive member P2 may be prevented or reduced from being transferring into the gap between the window 430 and the boss 420. In an embodiment, the height t2 of the first point L1 may be higher than the thickness t1 of the adhesive member P2 by about 0 to about 0.1 mm. In an embodiment, the distance d1 from the adhesive member P2 to the second surface 4222 may be about 0.3 mm or more to provide a sufficient space to receive the adhesive material transferred from the adhesive member P2. In an embodiment, at the first point L1, the distance d2 from a virtual line L extending in a direction perpendicular to the step surface 4211 to the second surface 4222 may be about 0.1 mm or more to provide a sufficient space for receiving the adhesive material from the adhesive member P2. In an embodiment, when the distance from the adhesive member P2 to the virtual line L is about 0.2 mm, at the first point L1, the distance d2 from a virtual line L extending in a direction perpendicular to the step surface 4211 to the second surface 4222 may be about 0.1 mm or more to provide a sufficient space for receiving the adhesive material from the adhesive member P2.

According to various embodiments, the window 430 may include an outer surface 4301, an inner surface 4302 facing away from the outer surface 4301, and a window side surface 4303 surrounding the space between the outer surface 4301 and the inner surface 4302. In an embodiment, the window 430 may include a printed layer 435 (e.g., a printed area) provided on the inner surface 4302. In an embodiment, the printed layer 435 may act as a BM area when viewed from the outside, preventing the internal lens housing 512 or an internal structure from being visible from the outside, or may act as an aperture for forming the angle of view of the camera module 510. In an embodiment, the printed layer 435 may be disposed on the inner surface 4302 of the window 430 to have a width greater than that of the adhesive member P2. In an embodiment, the window 430 may include a third surface 431 extending from a third point L3 of the outer surface 4301 to the window side surface 4303 and having a predetermined second angle θ2 with the outer surface 4301, and a fourth surface 432 extending from a fourth point L4 of the inner surface 4302 to the window side surface 4303 and having a predetermined third angle θ3 with the inner surface 4302. In an embodiment, the sum of the second angle θ2 and the third angle θ3 may be about 90 degrees. In some embodiments, the sum of the second angle θ2 and the third angle θ3 may be greater or less than about 90 degrees. In an embodiment, the third point L3 and the fourth point L4 may be arranged on the same vertical line that is directed perpendicular to the step surface. In this case, the second angle θ2 and the third angle θ3 may be about 45 degrees. In an embodiment, the adhesive member P2 may be disposed on the inner surface 4302 of the window 430 to be attached up to the fourth point L4. In an embodiment, the height (e.g., the vertical distance) of the fifth point L5, where the fourth surface 432 starts from the window side surface 4303, from the step surface 4211 may be higher than the height t2 (e.g., the vertical distance) from the first point L1 to the step surface 4211, which may help reduce damage to the window 430. In some embodiments, the height (e.g., the vertical distance) of the fifth point L5, where the fourth surface 432 starts from the window side surface 4303, from the step surface 4211 may be lower than the height t2 (e.g., the vertical distance) from the first point L1 to the step surface 4211. In this case, the first point L1 may have a curved shape with a certain curvature, which may help reduce damage to the window 430. In some embodiments, in the window 430, the third surface 431 may be omitted, and the outer surface 4301 may be perpendicularly connected to the window side surface 4303. In this case, the corner where the outer surface 4301 and the window side surface 4303 meet may be rounded. In some embodiments, in the window 430, the fourth surface 432 may be omitted, and the inner surface 4302 may be perpendicularly connected to the window side surface 4303. In this case, the corner where the inner surface 4302 and the window side surface 4303 meet may be curved. In some embodiments, in the window 430, both the third surface 431 and the fourth surface 432 may be omitted, and each of the corners where the outer surface 4301 and the inner surface 4302 meet the window side surface 4303 may also be rounded.

According to an embodiment, since the recess 422 is used as a space for the adhesive material transferred from the adhesive member P2 when the window 430 is attached to the step surface 4211 via a predetermined pressing force, a separate space into which the adhesive material is transferred due to the attachment of the window 430 and the step surface 4211 may not be required, which may help reduce the BM area when the same BM area is applied and may help ensure the fixing force of the window due to the expansion of the bonding area when the same BM area is applied.

Figure 5C:
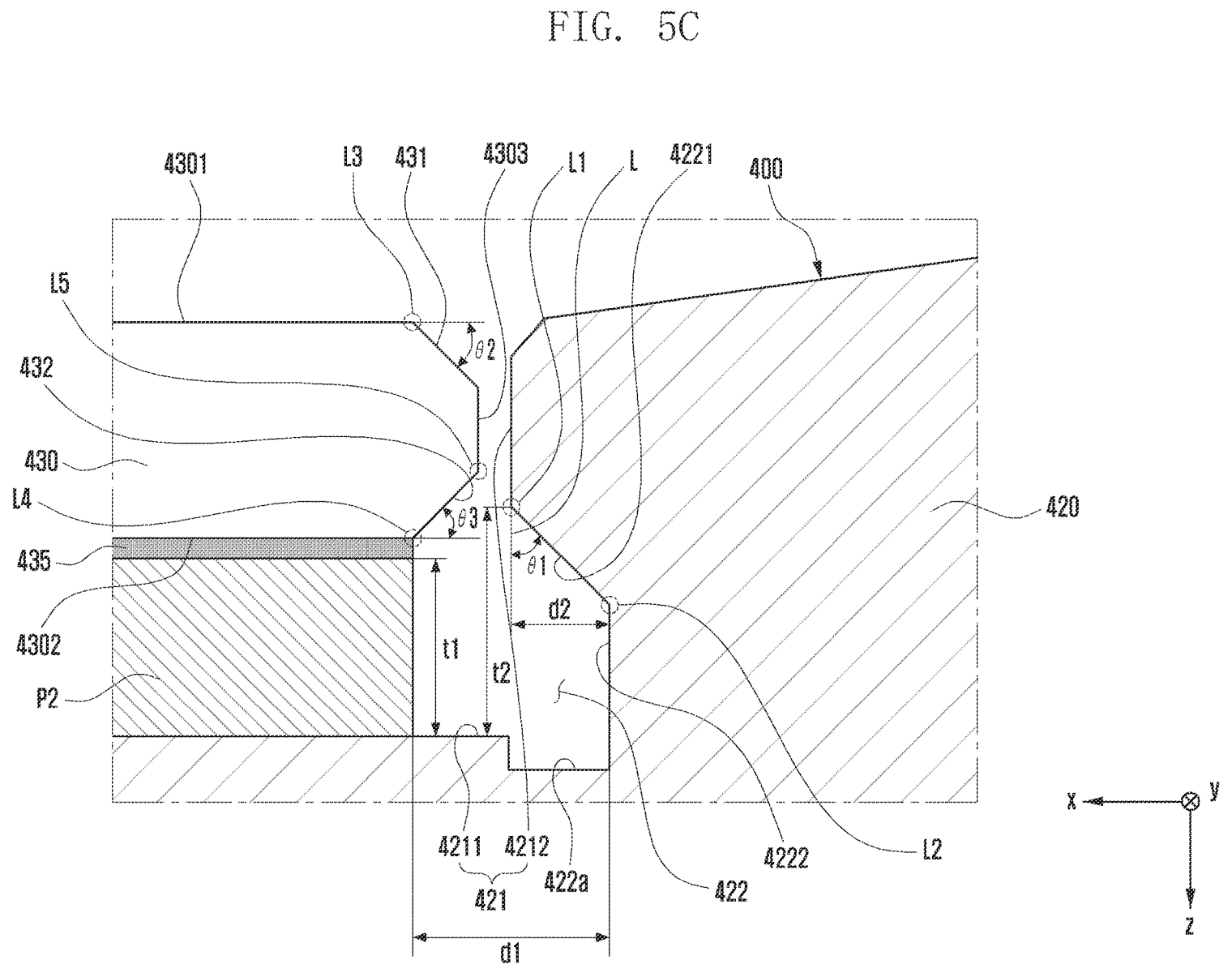
Figure 5D:
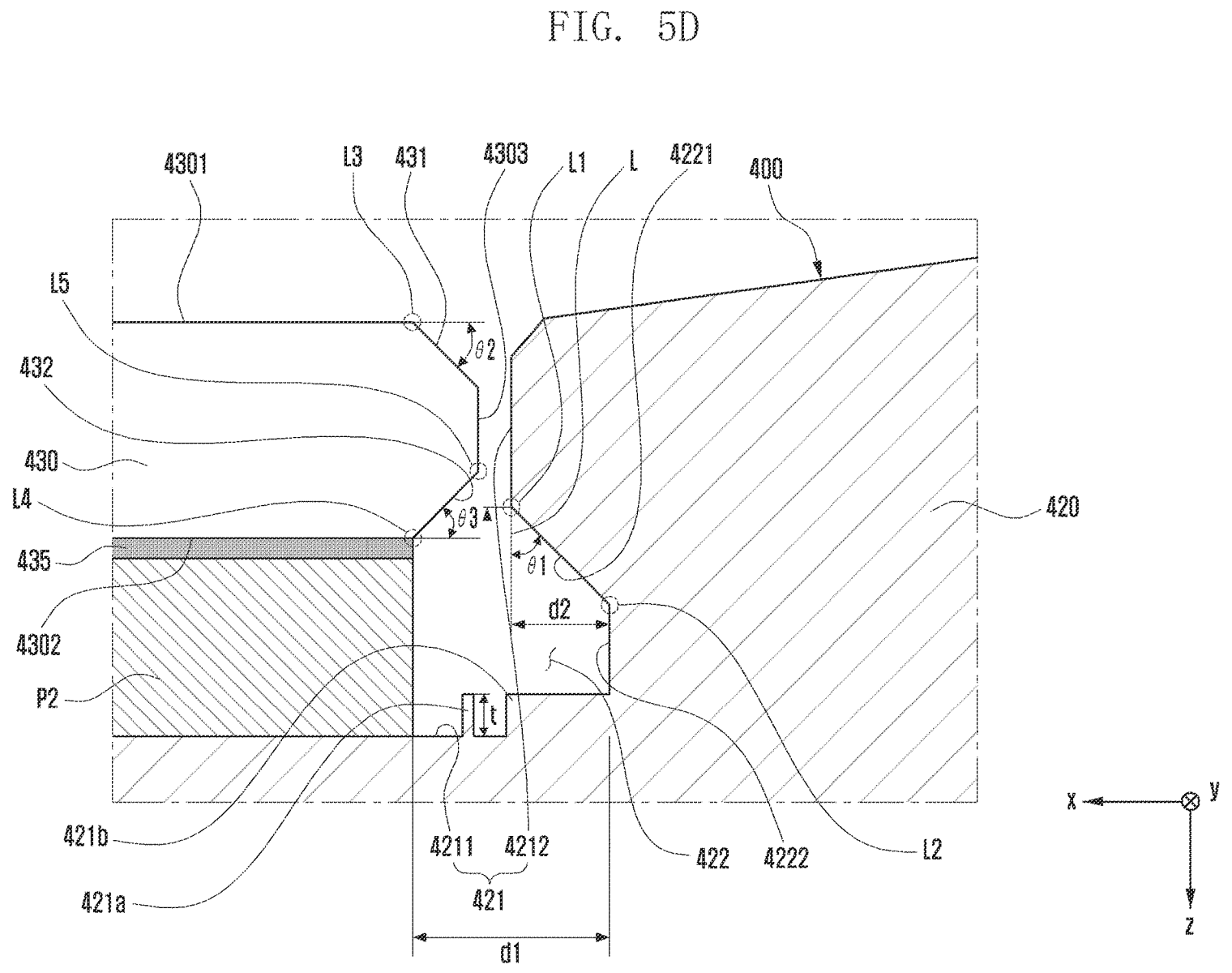

FIGS. 5C and 5D are partial cross-sectional views each illustrating a state in which a window is attached to a window bracket including a recess, according to an embodiment.

In describing FIGS. 5C and 5D, the same reference numerals are assigned to components that are substantially the same as those of FIG. 5B, and a detailed description thereof may be omitted.

In an embodiment and referring to FIG. 5C, the window bracket 400 may include a groove 422a provided lower than the step surface 4211. In an embodiment, the groove 422a may extend inward (e.g., in the −X-axis direction) from the point where the virtual line L extending vertically from the inner surface 4212 meets the step surface 4211 up to the second surface 4222. For example, the groove 422a provided lower than the step surface 4211 may help expand the space for receiving the adhesive material transferred from the adhesive member P2.

In an embodiment and referring to FIG. 5D, the window bracket 400 may include a stepped wall 421b, which is higher than the step surface 4211. In an embodiment, the stepped wall 421b may have a predetermined height t from the point where the virtual line L extending vertically from the inner surface 4212 meets the step surface 4211 to the second surface 4222. In an embodiment, the window bracket 400 may include a rib structure 421a disposed to be higher than the step surface 4211. In an embodiment, the rib structure 421a may extend from the step surface, or may be configured such that a separate structure is coupled thereto. In an embodiment, the rib structure 421a may have a height that is substantially the same as the height t of the stepped wall 421b. In some embodiments, the rib structure 421a may be disposed to be higher or lower than the height of the stepped wall 421b. In an embodiment, the rib structure 421a may have a predetermined height t from the step surface 4211, thereby helping to primarily receive or block the adhesive material transferred from the adhesive member P2. In an embodiment, the rib structure 421a may be disposed at a position overlapping the side surface 4303 when the window 430 is viewed from above, thereby helping ensure invisibility from the outside.

Figure 6A:
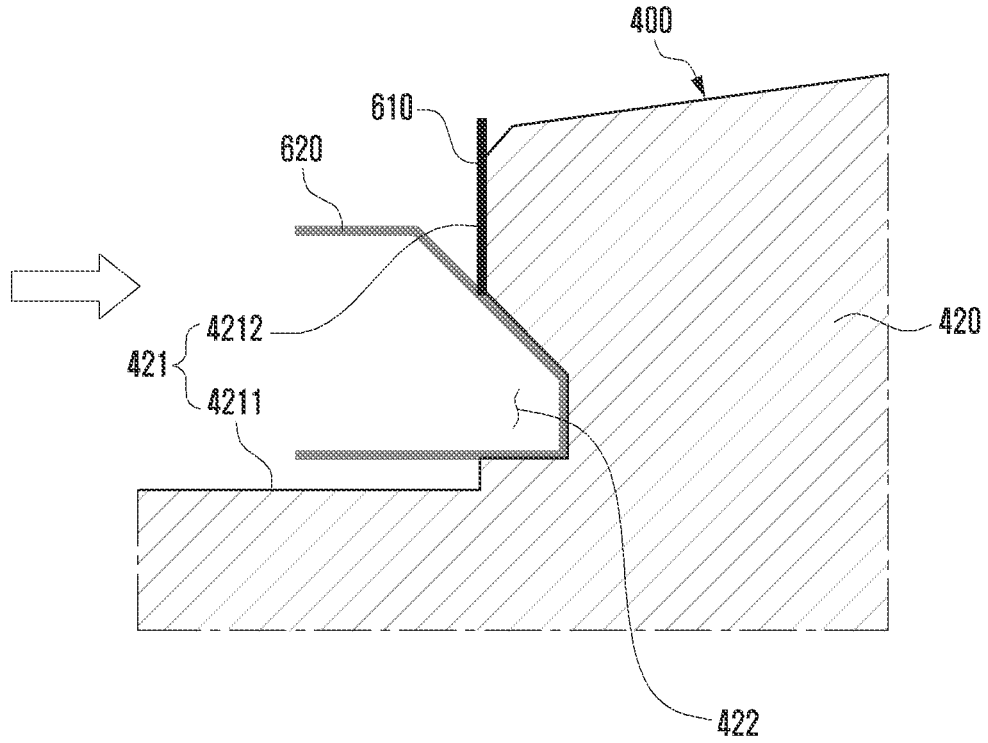
FIG. 6A is a schematic view illustrating a process for forming a recess using at least one tool, according to an embodiment.
Figure 6B:
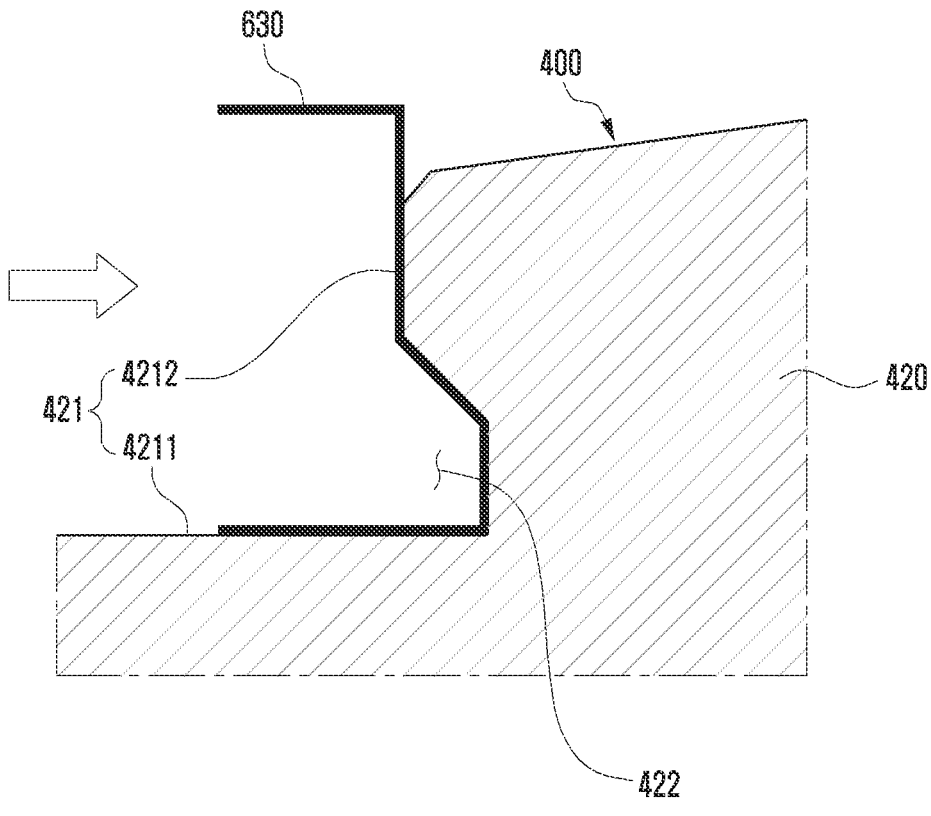
FIG. 6B is a schematic view illustrating a process for forming a recess using at least one tool, according to an embodiment.

FIGS. 6A and 6B are schematic views each illustrating a process for forming a recess using at least one tool, according to an embodiment.

In an embodiment and referring to FIG. 6A, a recess 422 may be formed by tools 610 and 620 (e.g., a forming tool) having two different tip shapes. For example, a stepped portion 421 may be formed by a first tool 610 having a tool tip with a shape corresponding to the step surface 4211 and the inner surface 4212, and then a recess 422 may be formed by a second tool 620 having a tool tip corresponding to the recess 422.

In an embodiment and referring to FIG. 6B, the stepped portion 421 and the recess 422 may be formed by a tool 630 having a tool tip corresponding to the shape of the stepped portion 421 and the shape of the recess 422.

FIGS. 7A to 7E are cross-sectional views each illustrating a coupled state between a window bracket including a recess and a window, according to an embodiment.

In an embodiment, in describing the configuration of the window 430 attached to the window bracket 400 of each of FIGS. 7A to 7E, components that are substantially the same as those of the window bracket 400 and the window 430 illustrated in FIGS. 5A and 5B are assigned the same reference numerals, and detailed descriptions thereof may be omitted.

In an embodiment and referring to FIGS. 7A to 7E, a recess 423, 424, 425, 426, or 427 formed on an inner surface 4212 of a stepped portion 421 formed on a boss 420 of a window bracket 400 may have various shapes.

Figure 7A:
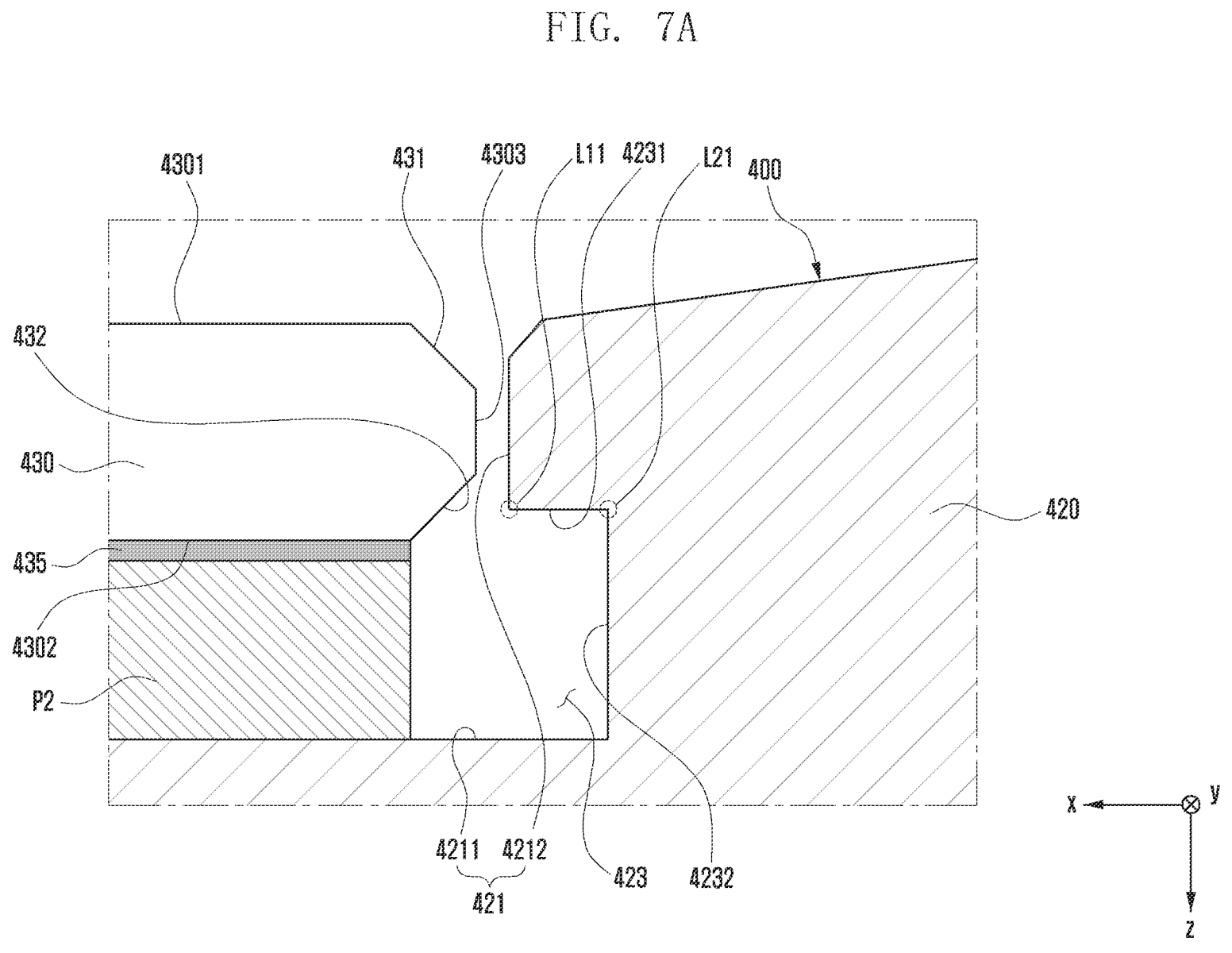

In an embodiment and referring to FIG. 7A, the window bracket 400 may include a recess 423 formed on the inner surface 4212 of the stepped portion 421 formed on the boss 420. In an embodiment, the recess 423 may include a first surface 4231 extending from a first point L11 on the inner surface 4212 in a direction perpendicular to the inner surface 4212, and a second surface 4232 extending perpendicularly from a second point L21 where the first surface 4231 ends to a step surface 4211. In an embodiment, the first surface 4231 and the second surface 4232 may be formed to extend perpendicularly to each other.

Figure 7B:
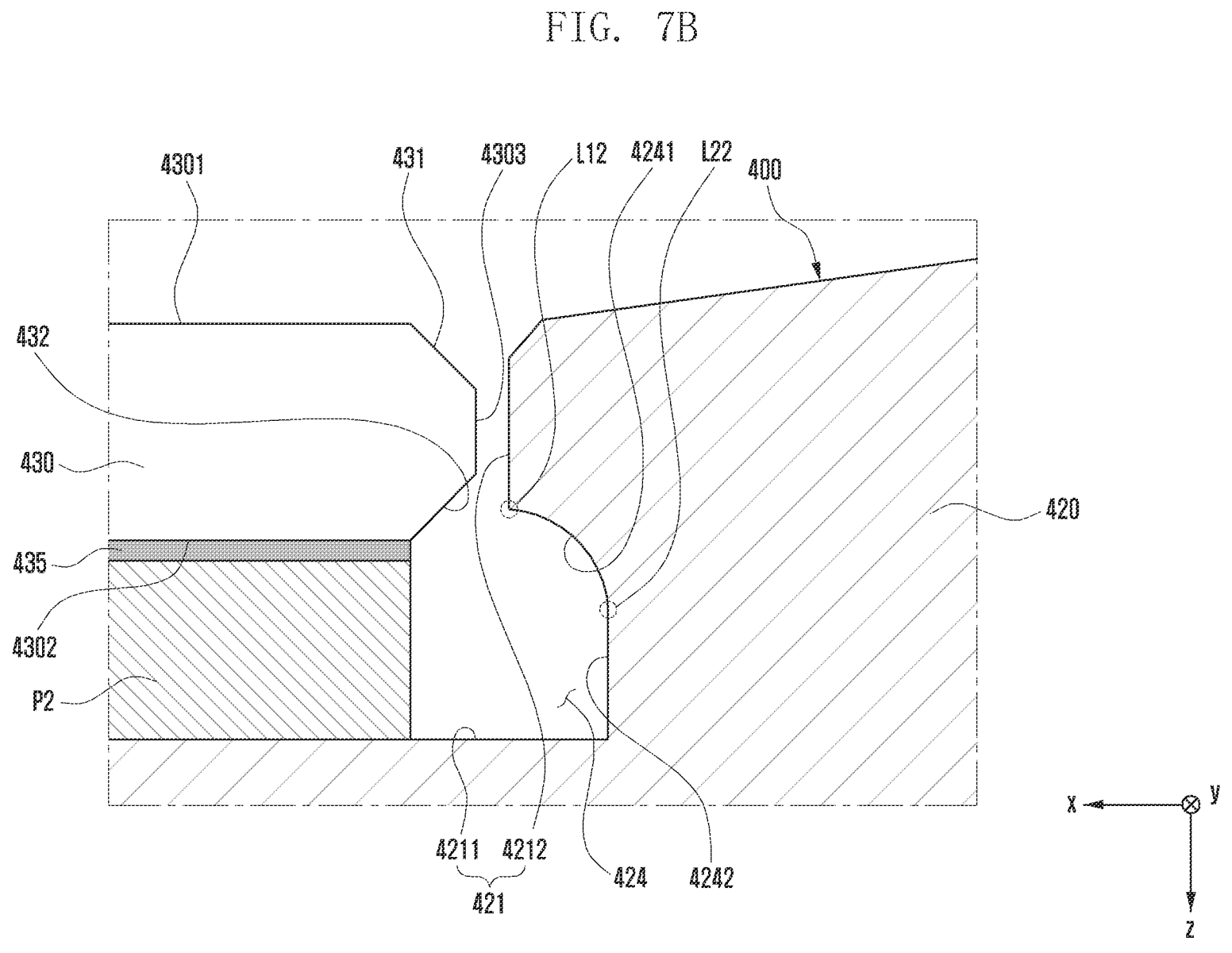

In an embodiment and referring to FIG. 7B, the window bracket 400 may include a recess 424 formed on the inner surface 4212 of the stepped portion 421 formed on the boss 420. In an embodiment, the recess 424 may include a first surface 4241 extending inward (e.g., in the −X-axis direction) from a first point L12 on the inner surface 4212, and a second surface 4242 extending perpendicularly from a second point L22 where the first surface 4241 ends to a step surface 4211. In an embodiment, the first surface 4241 may be formed as a curved surface with a predetermined curvature that is curved in an inward direction. In an embodiment, the second surface 4242 may be formed to extend perpendicularly to the step surface 4211.

Figure 7C:
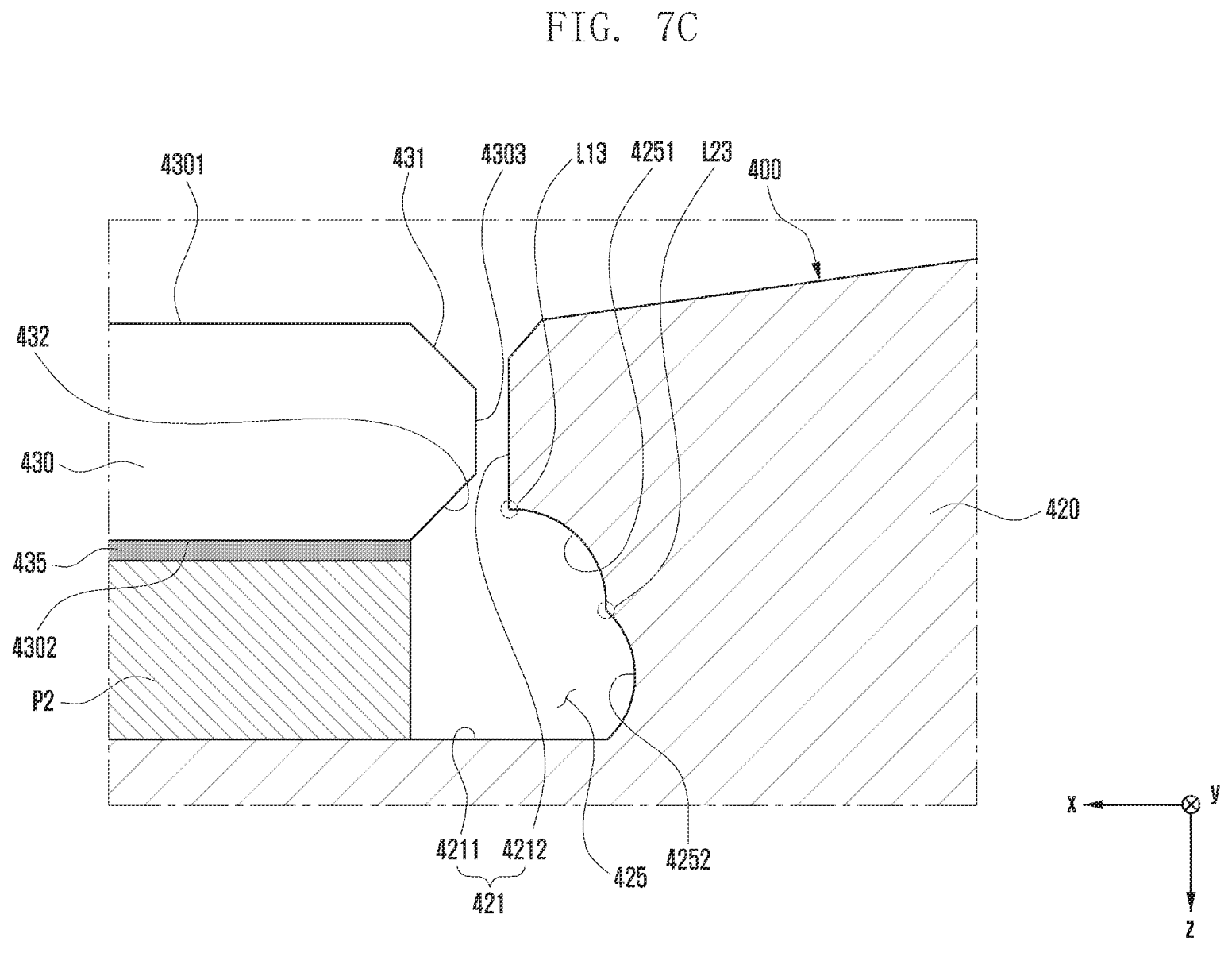

In an embodiment and referring to FIG. 7C, the window bracket 400 may include a recess 425 formed on the inner surface 4212 of the stepped portion 421 formed on the boss 420. In an embodiment, the recess 425 may include a first surface 4251 extending inward (e.g., in the −X-axis direction) from a first point L13 on the inner surface 4212, and a second surface 4252 extending from a second point L23 where the first surface 4251 ends to a step surface 4211. In an embodiment, the first surface 4251 may be formed as a curved surface with a predetermined first curvature that is curved in an inward direction. In an embodiment, the second surface 4252 may be formed as a curved surface with a predetermined second curvature that is curved in an inward direction and that extends to the step surface 4211. In an embodiment, the first curvature and the second curvature may be equal to or different from each other.

Figure 7D:
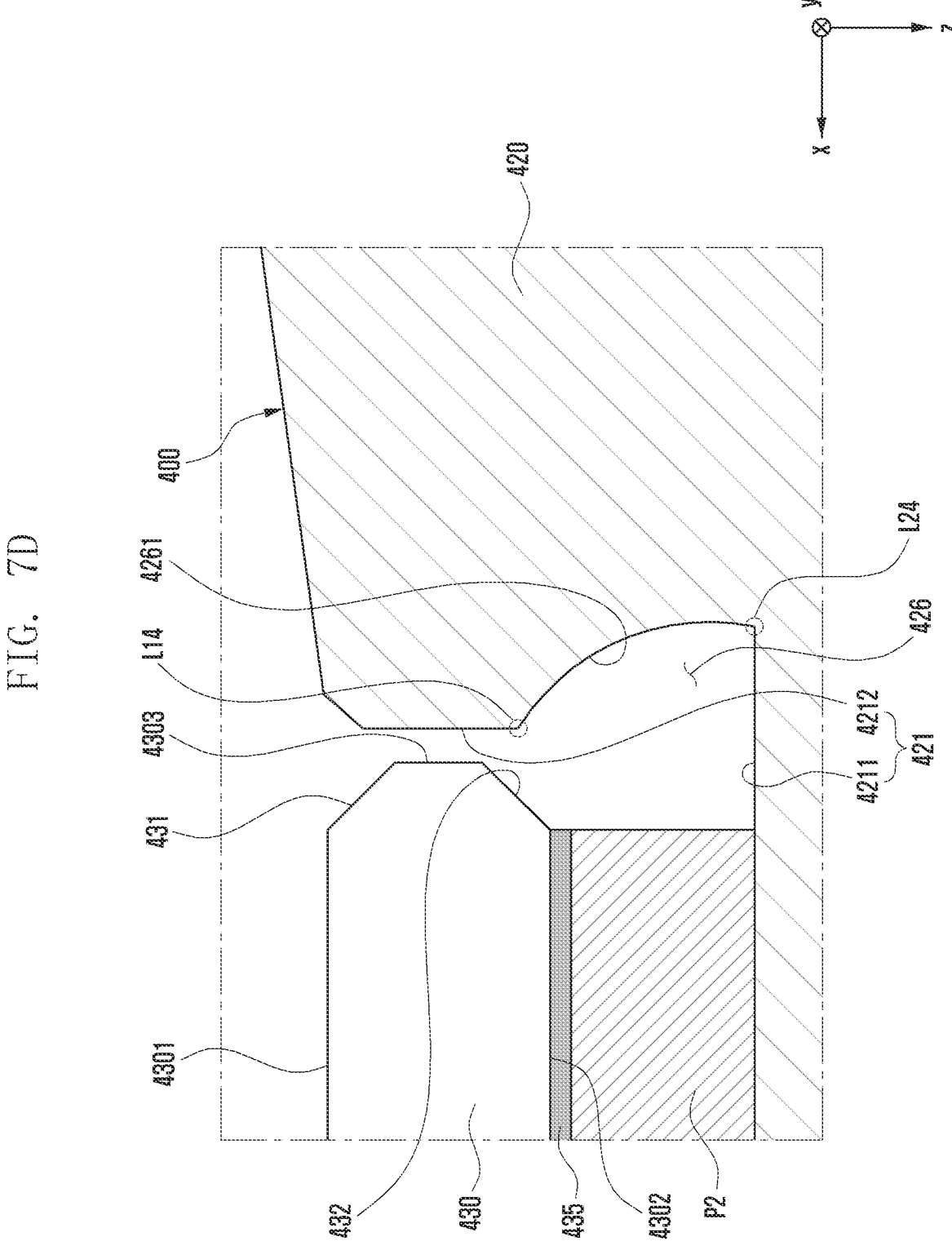
FIG. 7D is a cross-sectional view illustrating a coupled state between a window bracket including a recess and a window, according to an embodiment.

In an embodiment and referring to FIG. 7D, the window bracket 400 may include a recess 426 formed on the inner surface 4212 of the stepped portion 421 formed on the boss 420. In an embodiment, the recess 426 may include a first surface 4261 extending from a first point L14 on the inner surface 4212 to a second point L24 where the step surface 4211 meets the first surface 4261. In an embodiment, the first surface 4261 may be formed as a curved surface with a predetermined curvature that is curved in the inward direction (e.g., in the −x-axis direction) from the first point L14 and extends to the step surface 4211.

Figure 7E:
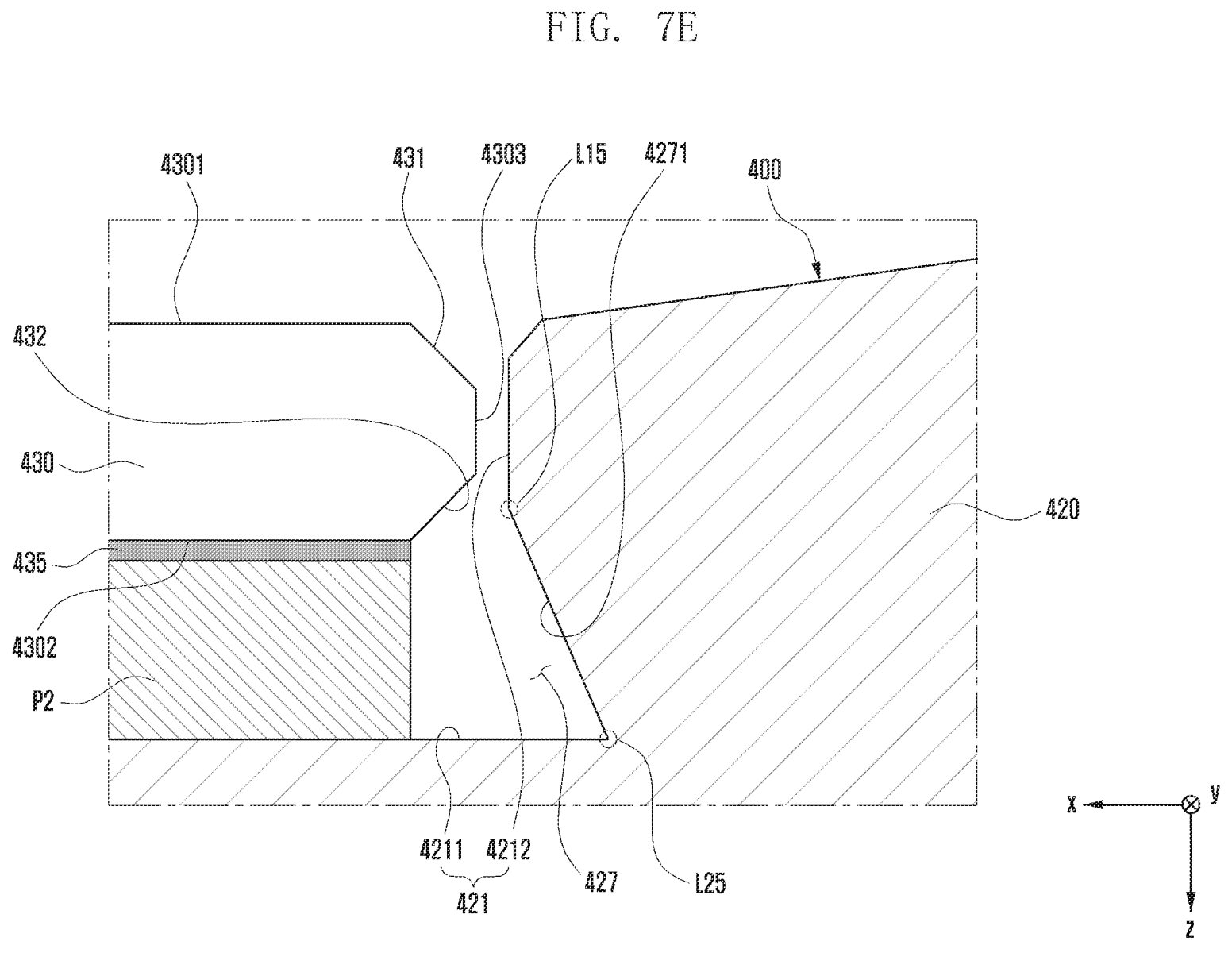

In an embodiment and referring to FIG. 7E, the window bracket 400 may include a recess 427 formed on the inner surface 4212 of the stepped portion 421 formed on the boss 420. In an embodiment, the recess 427 may include a first surface 4271 extending from a first point L15 on the inner surface 4212 to a second point L25 where the step surface 4211 meets the first surface 4271. In an embodiment, the first surface 4271 may be formed as a flat surface that is gradually directed inward from the first point L15 (e.g., in the −x-axis direction) and extends to the step surface 4211.

According to an embodiment, an electronic device (e.g., the electronic device 300 in FIG. 3) may include a housing (e.g., the housing 110 in FIG. 1), at least one optical module (e.g., the camera module 510 in FIG. 5A) disposed in an inner space (e.g., the inner space 3001 in FIG. 5A) of the housing, a window bracket (e.g., the window bracket 400 in FIG. 5B) disposed in the inner space of the housing to be at least partially connected to the outside, wherein the window bracket includes a flange (e.g., the flange 410 in FIG. 5A) including at least one opening (e.g., the opening 411 in FIG. 5A) disposed at a position corresponding to the at least one optical module, a boss (e.g., the boss 420 in FIG. 5B) extending to surround an edge of the at least one opening in a predetermined height from the flange, and a stepped portion (e.g., the stepped portion 421 in FIG. 5B) provided along the edge of the boss and including a step surface (e.g., the step surface 4211 in FIG. 5B) and an inner surface (e.g., the inner surface 4212 in FIG. 5B) extending perpendicularly from the step surface, and a window (e.g., the window 430 in FIG. 5B) attached to the window bracket via an adhesive member (e.g., the adhesive member P2 in FIG. 5B) disposed on at least a portion of the step surface, wherein the inner surface of the stepped portion may include a recess (e.g., the recess 422 in FIG. 5B) defined having a predetermined depth, and wherein the height (e.g., the height t2 in FIG. 5*b*) of the recess from the step surface to a first point (e.g., the first point L1 in FIG. 5*b*) where the recess starts may be greater than the thickness (e.g., the thickness t1 in FIG. 5B) of the adhesive member.

According to an embodiment, the recess may include a first surface (e.g., the first surface 4221 in FIG. 5*b*) extending inward from the first point on the inner surface at a first angle (e.g., the first angle θ1 in FIG. 5*b*), and a second surface (e.g., the second surface 4222 in FIG. 5B) extending from a second point (e.g., the second point L2 in FIG. 5B) where the first surface ends to the step surface.

According to an embodiment, the first angle may be greater than about 0 degrees and less than or equal to about 90 degrees.

According to an embodiment, the first surface may include a flat surface.

According to an embodiment, the second surface may include a flat surface extending in a vertical direction from the step surface to the second point.

According to an embodiment, the first surface and/or the second surface may include a curved surface.

According to an embodiment, the recess may be configured such that the distance (e.g., the distance d1 in FIG. 5B) from the adhesive member to the second surface is about 0.3 mm or more.

According to an embodiment, the recess may be configured such that the distance (e.g., distance d2 in FIG. 5B) from a virtual line extending in a direction perpendicular to the step surface at the first point to the second surface is about 0.1 mm or more.

According to an embodiment, the window may include an outer surface (e.g., the outer surface 4301 in FIG. 5B), an inner surface facing away from the outer surface (e.g., the inner surface 4302 in FIG. 5B), and a window side surface (e.g., the window side surface 4303 in FIG. 5B) surrounding the space between the outer surface and the inner surface, the adhesive member may be disposed between the inner surface and the step surface, and the inner surface may include a printed layer (e.g., the printed layer 435 in FIG. 5B) having a greater width than the adhesive member.

According to an embodiment, the electronic device may further include a third surface (e.g., the third surface 431 in FIG. 5B) extending from a third point (e.g., the third point L3 in FIG. 5B) on the outer surface to the window side surface, and configured to have a predetermined second angle (e.g., the second angle θ2 in FIG. 5B) with the outer surface, and a fourth surface (e.g., the fourth surface 432 in FIG. 5B) extending from a fourth point (e.g., the fourth point L4 in FIG. 5B) on the inner surface to the window side surface, and configured to have a predetermined second angle (e.g., the third angle θ3 in FIG. 5B) with the inner surface, where the sum of the second angle and the third angle may be about 90 degrees.

According to an embodiment, the adhesive member may be disposed up to the fourth point on the inner surface.

According to an embodiment, the first angle and the second angle may each be about 45 degrees.

According to an embodiment, the height of a fifth point (e.g., the fifth point L5 in FIG. 5B) where the fourth surface starts from the window side surface, from the step surface, may be higher than the height from the first point to the step surface.

According to an embodiment, the height from the step surface to the first point may be greater than the thickness of the adhesive member in the range of about 0 to about 0.1 mm.

According to an embodiment, the at least one optical module may include a camera module.

According to an embodiment, an electronic device (e.g., the electronic device 300 in FIG. 3A) may include a first structure (e.g., the window bracket 400 in FIG. 5A) including a stepped portion (e.g., the stepped portion 421 in FIG. 5B) including a step surface (e.g., the step surface 4211 in FIG. 5B) and an inner surface (e.g., the inner surface 4212 in FIG. 5B) extending from the step surface to a top surface, and a second structure (e.g., the window 430 in FIG. 5B) that is at least partially attached via an adhesive member (e.g., the adhesive member P2 in FIG. 5B) disposed on the step surface of the first structure, wherein the inner surface may include a recess (e.g., the recess 422 in FIG. 5B) defined having a predetermined depth, and wherein the height (e.g., the height t2 in FIG. 5B) of the recess from the step surface to a first point (e.g., the first point L1 in FIG. 5B) where the recess starts may be greater than the thickness (e.g., the thickness t1 in FIG. 5B) of the adhesive member.

According to an embodiment, the recess may include a first surface extending inward from a first point on the inner surface at a first angle, and a second surface extending from a second point where the first surface ends to the step surface.

According to an embodiment, the first angle may be greater than about 0 degrees and less than or equal to about 90 degrees.

According to an embodiment, the recess may be configured such that the distance from the adhesive member to the second surface is about 0.3 mm or more.

According to an embodiment, the recess may be formed such that the distance from a virtual line extending in a direction perpendicular to the step surface at the first point to the second surface is about 0.1 mm or more.

The embodiments of the invention disclosed in this specification and drawings are provided merely to propose specific examples in order to easily describe the technical features and to help understanding of the embodiments, and are not intended to limit the scope of the invention. Accordingly, the scope of the invention is to be construed in such a manner that, in addition to the embodiments disclosed herein, all changes or modifications are included in the scope of the various embodiments of the disclosure. Accordingly, the scope of the various embodiments should be interpreted to include all alterations or modifications. Moreover, the embodiment or parts of the embodiments may be combined in whole or in part without departing from the scope of the invention.

The invention claimed is:

1. An electronic device comprising:
a housing;
at least one optical module disposed in an inner space of the housing;

a window bracket disposed in the inner space of the housing to be at least partially connected to an outside of the electronic device, the window bracket comprising a flange comprising at least one opening disposed at a position corresponding to the at least one optical module, a boss extending to surround an edge of the at least one opening at a height from the flange, and a stepped portion provided along an edge of the boss and comprising a step surface and an inner side surface extending in a perpendicular direction relative to the step surface; and a window attached to the window bracket via an adhesive member-disposed on at least a portion of the step surface and comprising an outer surface, an inner surface facing away from the outer surface, a window side surface surrounding a space between the outer surface and the inner surface and an inclined surface connecting the inner surface and the window side surface, wherein the inner side surface comprises a recess defined having a depth, wherein a height of the recess from the step surface to a first point where the recess starts is greater than a thickness of the adhesive member, and wherein a height from a point where the inclined surface and the window side surface meet to the step surface is higher than a height from the first point to the step surface.

2. The electronic device of claim 1, wherein the recess comprises:

a first surface extending inward from the first point on the inner side surface at a first angle; and a second surface extending from a second point where the first surface ends to the step surface.

3. The electronic device of claim 2, wherein the first angle is greater than about 0 degrees and less than or equal to 90 degrees.

4. The electronic device of claim 2, wherein the first surface comprises a flat surface.

5. The electronic device of claim 4, wherein the second surface comprises a flat surface extending in a vertical direction from the step surface to the second point.

6. The electronic device of claim 2, wherein at least one of the first surface and the second surface comprises a curved surface.

7. The electronic device of claim 2, wherein the recess is configured such that a distance from the adhesive member to the second surface is 0.3 mm or more.

8. The electronic device of claim 2, wherein the recess is configured such that a distance from a virtual line extending in a direction perpendicular to the step surface at the first point to the second surface is greater than or equal to 0.1 mm.

9. The electronic device of claim 1, wherein the adhesive member is disposed between the inner surface and the step surface, and wherein the inner surface comprises a printed layer having a greater width than the adhesive member.

10. The electronic device of claim 9, further comprising:

a third surface extending from a third point on the outer surface to the window side surface, and configured to have a second angle with the outer surface; and a fourth surface extending from a fourth point on the inner surface to the window side surface, and configured to have a third angle with the inner surface, wherein a sum of the second angle and the third angle is 90 degrees, and wherein the fourth surface is the inclined surface.

11. The electronic device of claim 10, wherein the adhesive member is disposed up to the fourth point on the inner surface.

12. The electronic device of claim 10, wherein each of the first angle and the second angle is 45 degrees.

13. The electronic device of claim 1, wherein a height from the step surface to the first point is greater than a thickness of the adhesive member in a range of 0 to 0.1 mm.

14. The electronic device of claim 1, wherein the at least one optical module comprises a camera module.

15. An electronic device comprising:

a first structure comprising a stepped portion comprising a step surface and an inner side surface extending from the step surface to a top surface; and a second structure that is at least partially attached to the first structure via an adhesive member disposed on the step surface of the first structure and comprising an outer surface, an inner surface facing away from the outer surface, a side surface surrounding a space between the outer surface and the inner surface and an inclined surface connecting the inner surface and the side surface, wherein the inner side surface comprises a recess having a depth, and wherein a height of the recess from the step surface to a first point where the recess starts is greater than a thickness of the adhesive member, and wherein a height from a point where the inclined surface and the side surface meet to the step surface is higher than a height from the first point to the step surface.

16. The electronic device of claim 15, wherein the recess comprises:

a first surface extending inward from the first point at a first angle; and a second surface extending from a second point where the first surface ends to the step surface.

17. The electronic device of claim 16, wherein the first angle is greater than about 0 degrees and less than or equal to 90 degrees.

18. The electronic device of claim 16, wherein the recess is configured such that a distance from the adhesive member to the second surface is 0.3 mm or more.

19. The electronic device of claim 16, wherein the recess is configured such that a distance from a virtual line extending in a direction perpendicular to the step surface at the first point to the second surface is greater than or equal to 0.1 mm.

* * * * *